(12) United States Patent
Lee et al.

(10) Patent No.: US 8,546,485 B2
(45) Date of Patent: Oct. 1, 2013

(54) PHOTOCURABLE DICING DIE BONDING TAPE

(71) Applicant: Henkel Corporation, Rocky Hill, CT (US)

(72) Inventors: Byoungchul Lee, Cypress, CA (US); Pauline Chiang, Irvine, CA (US); Kevin Harris Becker, Cerritos, CA (US)

(73) Assignee: Henkel Corporation, Rocky Hill, CT (US)

( * ) Notice: Subject to any disclaimer, the term of this patent is extended or adjusted under 35 U.S.C. 154(b) by 0 days.

(21) Appl. No.: 13/785,488

(22) Filed: Mar. 5, 2013

(65) Prior Publication Data

US 2013/0178585 A1 Jul. 11, 2013

Related U.S. Application Data

(63) Continuation of application No. PCT/US2011/065346, filed on Dec. 16, 2011.

(60) Provisional application No. 61/424,860, filed on Dec. 20, 2010.

(51) Int. Cl.
*C09J 175/06* (2006.01)
*C09J 183/04* (2006.01)
*C09J 133/08* (2006.01)

(52) U.S. Cl.
USPC .............................................. 525/28; 525/72

(58) Field of Classification Search
None
See application file for complete search history.

(56) References Cited

U.S. PATENT DOCUMENTS

| | | | |
|---|---|---|---|
| 2,718,516 A | | 9/1955 | Bortnick |
| 2,821,544 A | | 1/1958 | Holtschmidt |
| 3,632,796 A | * | 1/1972 | Holicky et al. ............... 525/278 |
| 3,694,415 A | * | 9/1972 | Honda et al. .................... 522/96 |
| 4,192,762 A | * | 3/1980 | Osborn .................... 252/182.18 |
| 4,271,223 A | * | 6/1981 | Lambert et al. ............... 428/207 |
| 4,343,919 A | | 8/1982 | Tefertiller et al. |
| 4,377,530 A | | 3/1983 | Trenbeath et al. |
| 4,439,616 A | | 3/1984 | Singh et al. |
| 4,902,727 A | * | 2/1990 | Aoki et al. ...................... 522/90 |
| 5,296,277 A | * | 3/1994 | Wilson et al. ................ 428/40.2 |
| 5,514,522 A | * | 5/1996 | Fitzgerald et al. ......... 430/284.1 |
| 5,556,924 A | * | 9/1996 | Fitzgerald et al. ............ 525/293 |
| 5,932,352 A | | 8/1999 | Higgins |
| 6,159,595 A | * | 12/2000 | Sumi ............................. 428/336 |
| 2007/0213463 A1 | | 9/2007 | Sherman et al. |
| 2007/0275255 A1 | | 11/2007 | Ooms et al. |
| 2009/0075008 A1 | | 3/2009 | Hwang et al. |
| 2010/0015441 A1 | | 1/2010 | Zhao et al. |
| 2011/0053346 A1 | | 3/2011 | Matsummura et al. |

FOREIGN PATENT DOCUMENTS

WO 9500573 A1 1/1995

* cited by examiner

*Primary Examiner* — Robert S Loewe
(74) *Attorney, Agent, or Firm* — Sun Hee Lehmann

(57) ABSTRACT

A pressure sensitive adhesive comprising (A) pressure sensitive adhesive polymers having pendant carbon-carbon unsaturation and (B) hydrophobic polymers terminated with carbon-carbon unsaturation. In one embodiment the hydrophobic polymers are vinyl terminated polydimethoxyl siloxane polymers and/or vinyl terminated fluoropolymers reduces the interaction of the pressure sensitive adhesive with adherends and provides excellent release of the pressure sensitive adhesive after cure.

3 Claims, No Drawings

PHOTOCURABLE DICING DIE BONDING TAPE

BACKGROUND OF THE INVENTION

This invention relates to a photocurable pressure sensitive adhesive coated on a polyolefin base film that is used in the manufacture of semiconductor devices.

A semiconductor wafer, such as one prepared from silicon or gallium arsenide, is initially manufactured in a size larger than is used for the individual semiconductors. The wafer is typically thinned by grinding, and cut into small individual semiconductor dies, which are then transferred and adhered to the desired substrates. To support the wafer during these operations, and to streamline the process of bonding the die to the desired substrate, the wafer is adhered to a support tape that has a die bonding adhesive layer and a pressure sensitive adhesive layer, with the pressure sensitive adhesive layer situated between the adhesive layer and the support tape.

After the manufacturing operations, the pressure sensitive adhesive layer is cured and hardened by UV irradiation so that it releases from the adhesive layer that will be used for die bonding. In these operations, controlling the adhesion of the pressure sensitive adhesive so that it adheres tightly before photocure and releases cleanly and easily after photocure is important. The capability of releasing cleanly after cure is particularly important for subsequent fabrication steps. Conventional UV curable pressure sensitive adhesives do not always achieve a clean separation, thus creating a need for adhesives for use in semiconductor fabrication with improved release performance.

BRIEF SUMMARY OF THE INVENTION

This invention is a pressure sensitive adhesive composition comprising (A) pressure sensitive adhesive polymers having pendant carbon-carbon unsaturation and (B) hydrophobic polymers terminated with carbon-carbon unsaturation. In one embodiment the hydrophobic polymers are vinyl terminated siloxane polymers and/or vinyl terminated fluoropolymers. In another embodiment, the pressure sensitive adhesive further comprises a polyisocyanate, in an amount effective to partially crosslink the composition.

The high hydrophobicity of siloxane polymers and fluoropolymers reduces the interaction of the pressure sensitive adhesive with adherends and provides excellent release of the pressure sensitive adhesive after cure. The presence of unsaturation on all the termini of the hydrophobic polymers assures that the hydrophobic component (B) is reacted with the pressure sensitive adhesive polymers (A) having pendant carbon-carbon unsaturation. If only one end of the hydrophobic polymer chain is unsaturated, the possibility of any unreacted hydrophobic polymer migrating to the surface of the adherend (substrate) and causing contamination is increased.

In one embodiment the pressure sensitive polymers (A) having pendant carbon-carbon unsaturation are polymers having a polyethylenic backbone and at least one pendant acryloyl urethane group. The pendant acryloyl urethane group reacts upon exposure to actinic radiation, and/or chemical initiation. The polyethylenic backbone is a hydrocarbon chain that results from the addition polymerization of ethylenically unsaturated monomers.

DETAILED DESCRIPTION OF THE INVENTION

In one method, the pressure sensitive adhesive polymers (A) of the present invention are prepared by (1) polymerizing an isocyanate monomer with ethylenic unsaturation singularly or in combination with other ethylenically unsaturated monomer(s) under conditions sufficient to cause the addition polymerization of the ethylenically unsaturated groups, thereby forming a precursor polymer with a polyethylenic chain and pendant isocyanate groups, and (2) reacting the isocyanato group(s) pendant to the polyethylenic chain of the precursor polymer with an active hydrogen compound containing an acryloyl group. This method and resultant compounds are disclosed in U.S. Pat. No. 4,343,919.

Isocyanate monomers suitable for use in the above reaction are those having an isocyanate group and an ethylenically unsaturated group capable of undergoing free radical initiated addition polymerization. Representative isocyanates are the isocyanato alkyl esters of α,β-ethylenically unsaturated carboxylic acids, monovinylidene aryl isocyanates and monovinylidene arylmethyl isocyanates.

Exemplary isocyanatoalkyl esters include 2-isocyanatoethyl methacrylate, 2-isocyanatoethyl acrylate, 3-isocyanatopropyl methacrylate, 1-methyl-2-isocyanatoethyl methacrylate and 1,1-dimethyl-2-isocyanatoethyl acrylate. Exemplary monovinylidene aromatic isocyanates and monovinylidene arylmethyl isocyanates include styrene isocyanate and vinylbenzyl isocyanate.

Suitable ethylenically unsaturated monomers for polymerizing with the isocyanate compounds are any ethylenically unsaturated monomers inert to the isocyanate groups. Exemplary ethylenically unsaturated monomers include aliphatic conjugated dienes, such as, butadiene and isoprene; monovinylidene aromatic monomers such as styrene, α-methyl styrene, (t-butyl)styrene, chlorostyrene, cyanostyrene and bromostyrene; alkyl esters of α,β-ethylenically unsaturated carboxylic acids, such as, methyl methacrylate, ethyl acrylate, butyl acrylate; α,β-ethylenically unsaturated nitriles, anhydrides and amides, such as, acrylonitrile, methacrylonitrile, maleic anhydride, acrylamide, methacrylamide, N,N-dimethyl acrylamide, N-(dimethylaminomethyl) acrylamide; vinyl esters, such as, vinyl acetate; vinyl ethers; vinyl ketones; vinyl and vinylidene halides. Other ethylenically unsaturated monomers are recited further in this specification. In one embodiment, the ethylenically unsaturated monomers are selected from the group consisting of styrene, butyl acrylate and methyl methacrylate.

The relative proportions of isocyanate monomer to other monomers is not particularly critical provided that there is at least one isocyanate group, preferably at least two isocyanate groups, on the precursor polymer. Typically there is about 10 to about 50 mole percent isocyanate monomer and from about 50 to about 90 mole percent of other monomers, based on total monomers.

The reaction of the polymer precursor with an active hydrogen acryloyl compound is carried out in the presence of a urethane catalyst, for example, an amine or an organometallic catalyst such as stannous octoate or dibutyltin dilaurate. The conditions employed for carrying out the urethane reaction are known to those skilled in the art. The amount of the isocyanate groups of the polymer precursor is preferably stoichiometric or slightly in excess of the active hydrogen groups of the active hydrogen compound.

The active hydrogen acryloyl compound can be any containing an acryloyl group and an active hydrogen moiety. Illustrative of active hydrogen moieties are —COOH, —OH, —NH$_2$, —NH—, —CONH$_2$, —SH and —CONH—. Exemplary active hydrogen monomers include aminohydrocarbyl and hydroxyhydrocarbyl esters of acrylic acid, such as, hydroxyethyl acrylate, hydroxypropyl acrylate, aminoethyl acrylate, N-(methyl)acrylamide, N-(methylol)acrylamide and N-(aminomethyl)acrylamide; acrylic acid; and mercaptoalkyl esters of acrylic acid such as mercaptoethyl acrylate. In one embodiment, the active hydrogen compound is hydroxyethyl acrylate.

In another method, the pressure sensitive adhesive polymers (A) of the present invention are prepared by (1) polymerizing a monomer containing both hydroxyl groups and ethylenic unsaturation singularly or in combination with other ethylenically unsaturated monomer(s) under conditions sufficient to cause the addition polymerization of the ethylenically unsaturated groups, thereby forming a precursor polymer with a polyethylenic chain and pendant hydroxyl groups, and (2) reacting the hydroxyl group(s) pendant to the polyethylenic backbone of the precursor polymer with one or more ethylenically unsaturated isocyanates. This method and resultant compounds are disclosed in PCT Patent Application WO 95/00573.

Hydroxyl-containing monomers suitable for use in the above reaction are those having an hydroxyl group and an ethylenically unsaturated group capable of undergoing free radical initiated addition polymerization. Representative hydroxyl-containing monomers are the hydroxyalkyl esters of α,β-ethylenically unsaturated carboxylic acids, such as hydroxyalkyl acrylates and hydroxyalkyl methacrylates. In one embodiment the hydroxyl-containing monomers are 2-hydroxyethyl acrylate (HEA) and hydroxypropyl acrylate (HPA).

Other suitable hydroxyl-containing compounds are the ethylene oxide and propylene derivatives of HEA and HPA, containing from 1 to about 20 moles of the alkylene oxide; caprolactone acrylates and methacrylates, which are epsilon-caprolactone derivatives of HEA and HPA containing from 1 to about 6 moles of epsilon-caprolactone; and carboxylic acid terminated adducts of HEA and HPA.

Suitable ethylenically unsaturated monomers for polymerizing with the hydroxyl-containing compounds are any ethylenically unsaturated monomers inert to the hydroxyl groups. These include the ethylenically unsaturated compounds mentioned above in this specification for reacting with the isocyanate containing compounds. Other exemplary compounds include methyl (meth)acrylate, ethyl (meth)acrylate, propyl (meth)acrylate, butyl (meth)acrylate, pentyl (meth)acrylate, hexyl (meth)acrylate, heptyl (meth)acrylate, octyl (meth)acrylate, nonyl (meth)acrylate, decyl (meth) acrylate, (meth)acrylic acid, vinyl acetate, vinyl propionate, vinyl butyrate, vinyl pivalate, vinyl hexanoate, vinyl heptanoate, vinyl octanoate, vinyl isovalerate, vinyl 2-ethylhexanoate, vinyl benzoate, vinyl crotonate, vinyl laurate, vinyl myristate, vinyl linoleate, vinyl linolenate, vinyl cinnamate, vinyl stearate, vinyl oleate, vinyl napthanoate, vinyl cyclopentanoate, vinyl versatate, vinyl salicylate, monovinyl adipate, styrene, vinyl cyclohexane, vinyl cyclopentane, vinyl toluene, vinyl anthracene, 3-vinyl benzyl chloride, 4-vinyl biphenyl, 4-vinyl-1-cyclohexene, vinyl cyclooctane, 2-vinyl naphthalene, 5-vinyl-2-norbornene, 1-vinyl imidazole, 2-vinyl pyridine, 4-vinyl pyridine, 1-vinyl-2-pyrrolidinone, 9-vinyl carbazole, 3-vinylbenzyl chloride, vinyl chloride, vinylidine chloride, vinyl fluoride, vinylidine fluoride, ethylene, propylene, butene, pentene, hexene, heptene, octene, nonene, decene, 4-chloro-1-butene, 4,6-dichloro-1-hexene, 5-fluoro-2-hexene, acrylonitrile, methacrylonitrile, methyl vinyl ether, ethyl vinyl ether, propyl vinyl ether, butyl vinyl ether, pentyl vinyl ether, hexyl vinyl ether, heptyl vinyl ether, octyl vinyl ether, 2-methyl-1-butyl vinyl ether, acrylic acid, methacrylic acid, ethacrylic acid, alpha-chloroacrlic acid, crotonic acid, fumaric acid, citraconic acid, mesaconic acid, itaconic acid, and maleic acid.

The precursor polymers are prepared by conventional techniques known to those skilled in the art of polymerization. The relative proportions of hydroxyl monomer to other monomers is not particularly critical provided that there is at least one hydroxyl group, preferably at least two hydroxyl groups, on the precursor polymer. Other functional groups, such as carboxyl and amine may also be present in the hydroxyl functional precursor polymers.

The isocyanate compound for reacting with the precursor polymer can be any containing an ethylenically unsaturated group and an isocyanate group. Illustrative of the ethylenically unsaturated isocyanates that can be used to react with the precursor polymer are the isocyanato alkyl (meth)acrylates, such as, 2-isocyanatoethyl methacrylate, 3-isocyanatopropyl methacrylate, and the like; monoisocyanates prepared from diolefins, such as, 1-(1- isocyanato-1-methyl ethyl)-3-(1-methyl ethenyl) benzene (p-TMI), 1-(1-isocyanato-1-methyl ethyl)-4-(1-methyl ethenyl) benzene (m-TMI), 1-(1- isocyanato-1-methyl propyl)-3-(1-methyl propenyl) benzene, 1-(1- isocyanato-1-methyl propyl)-4-(1-methyl propenyl) benzene, 1-(1- isocyanato- 1-methyl propyl)-4-(1-methyl ethenyl) benzene, 1-(1- isocyanato-1-ethyl)-3-(1-ethenyl) benzene, 1-(1-isocyanato-1-ethyl)-4-(1-ethenyl) benzene, and the like. Methods for manufacture of such isocyanates can be found in U.S. Pat. No. 2,718,516, U.S. Pat. No. 2,821,544, U.S. Pat. No. 4,377,530 and U.S. Pat. No. 4,439,616; certain of the isocyanates are commercially available. Mixtures of various ethylenically unsaturated isocyanates may be used.

Although not essential, a stoichiometric deficiency of the ethylenically unsaturated isocyanate may be employed in order to leave some hydroxyl functionality in the polymer. Excess isocyanate is generally avoided since it introduces residual unpolymerized monomer. At least about 0.5% of the ethylenically unsaturated isocyanate, based on the weight of the polymer, is used. Based on the hydroxyl content of the precursor polymer, typically at least about 5% of the hydroxyl functionality is consumed by reaction with the ethylenically unsaturated isocyanate, and that amount can be as high as 90%.

The polyisocyanate is added to the composition just prior to use. Suitable polyisocyanates include diisophorone, toluene diisocyanate (TDI), diphenylmethane diisocyanate (MDI), and 1,5-naphthalene diisocyanate (NDI).

Suitable hydrophobic polymers for reacting with the pressure sensitive adhesive polymers include vinyl terminated polydimethoxyl siloxane polymers and vinyl terminated fluoropolymers. Exemplary vinyl terminated polydimethoxyl siloxane polymers include DMS-V46 and DMS-52 from Gelest. Exemplary vinyl terminated fluoropolymers include reaction product of Lumiflon 200 and Lumiflon 552 (Asahi Glass) with MOI. Lumiflon 200 and Lumiflon 552 are fluoropolymer having hydroxyl group on the polymer backbone. This hydroxyl group reacts with MOI and unsaturated carbon-carbon double is incorporated to fluoropolymer backbone. The hydrophobic polymers are present in an amount up to 5 weight percent (but not 0 wt. %) based on the total solid content of the composition. Typically the hydrophobic polymers are blended with the pressure sensitive adhesive polymers in a suitable solvent, such as, ethyl acetate.

CONTROL EXAMPLE

A pressure sensitive adhesive (PSA) was prepared from the copolymerization of 2-ethylhexyl acrylate (14 g), butyl acrylate (63 g), and 2-hydroxyethyl acrylate (23 g) in ethyl acetate (100 g) with a free radical initiator and heated to 90° C. (jacket temperature) until the reaction was complete. To this precursor polymer was added methacryloyloxyethyl isocyanate (24.10 g) and dibutyltin dilaurate (0.065 g) as catalyst, and the composition mixture reacted for eight hours at room temperature. Isophorone diisocyanate (3.27 g) was added and the mixture reacted for another 30 minutes at room temperature. The resultant PSA polymer was coated on a PET release liner. The coated PSA was laminated to polyolefin base film at room temperature to make a dicing tape. To this dicing tape, a die bonding film was laminated to make a combination dicing die bonding film. The dicing die bonding film was laminated to a 75 um thick silicon wafer and the silicon wafer diced, using a dicing saw having an ultra thin diamond blade at a speed greater than 20,000 rpm, into a plurality of individual dies.

EXAMPLE 1

A pressure sensitive adhesive (PSA) was prepared from the copolymerization of 2-ethylhexyl acrylate (14 g), butyl acrylate (63 g), and 2-hydroxyethyl acrylate (23g) in ethyl acetate (100 g) with a free radical initiator and heated to 90° C. (jacket temperature) until the reaction was complete. To this precursor polymer was added vinyl terminated polydimethoxylsiloxane (DMS-V46) (1.0 g), methacryloyloxyethyl isocyanate (MOI) (24.10 g) and dibutyltin dilaurate (0.065g) as catalyst, after which the composition mixture was reacted for eight hours at room temperature. Isophorone diisocyanate (3.27 g) was added and the mixture reacted for another 30 minutes at room temperature. The resultant PSA polymer was coated on a PET release liner. The coated PSA was laminated to polyolefin base film at room temperature to make a dicing tape. To this dicing tape, a die bonding film was laminated to make a combination dicing die bonding film. The dicing die bonding film was laminated to a 75 um thick silicon wafer and the silicon wafer diced, using a dicing saw having an ultra thin diamond blade at a speed greater than 20,000 rpm, into a plurality of individual dies.

EXAMPLE 2

A pressure sensitive adhesive (PSA) was prepared from the copolymerization of 2-ethylhexyl acrylate (14 g), butyl acrylate (63 g), and 2-hydroxyethyl acrylate (23 g) in ethyl acetate (100 g) with a free radical initiator and heated to 90° C. (jacket temperature) until the reaction was complete. To this precursor polymer was added vinyl terminated fluoropolymer (adduct of LF 200 and methacryloyloxyethyl isocyanate (MOI) (24.10 g) and dibutyltin dilaurate (0.065 g) as catalyst, after which the composition mixture was reacted for eight hours at room temperature. (The vinyl terminated fluoropolymer was prepared by the reaction of fluoropolymer (10 g) (LF 200) with 1.5 g MOI.) (In some samples, toluene or xylene may be used in the composition to help stabilize the hydrophobic polymer). Isophorone diisocyanate (3.27 g) was added and the mixture reacted for another 30 minutes at room temperature. The resultant PSA polymer was coated on a PET release liner. The coated PSA was laminated to polyolefin base film at room temperature to make a dicing tape. To this dicing tape, a die bonding film was laminated to make a combination dicing die bonding film. The dicing die bonding film was laminated to a 75 um thick silicon wafer and the silicon wafer diced, using a dicing saw having an ultra thin diamond blade at a speed greater than 20,000 rpm, into a plurality of individual dies.

The following table shows the performance results of Examples 1 and 2 containing the hydrophobic polymer compared to the control example without the hydrophobic polymer. The higher the needle pin height, the poorer the pick-up performance.

| | Control | Example 1 | Example 2 |
|---|---|---|---|
| Hydrophobic polymer for release | | Siloxane polymer DMS-V46 | Fluoropolymer Adduct of LF 200 and MOI |
| Peel strength to die bonding film after UV cure | 0.089 N/cm | 0.052 N/cm | 0.055 N/cm |
| Pick-up performance by needle pin height | >0.4 mm | 0.2 mm | 0.25 mm |

We claim:
1. A pressure sensitive adhesive composition comprising:
   (A) pressure sensitive adhesive polymers having pendant carbon-carbon unsaturation, and
   (B) hydrophobic polymers terminated with carbon-carbon unsaturation.
2. The pressure sensitive adhesive composition of claim 1 further comprising a polyisocyanate in an amount effective to partially crosslink the (A) and (B) polymers of the composition.
3. The pressure sensitive adhesive composition of claim 2 in which the polyisocyanate is selected from the group consisting of diisophorone diisocyanate, toluene diisocyanate, diphenylmethane diisocyanate, and 1,5-naphthalene diisocyanate.

* * * * *